United States Patent [19]

Meschkat et al.

[11] Patent Number: 4,789,999

[45] Date of Patent: Dec. 6, 1988

[54] LINE CIRCUIT FOR COUPLING A SUBSCRIBER SET TO A SWITCHING FACILITY TO PROVIDE A COMPLEX IMPEDANCE MATCH

[75] Inventors: Peter Meschkat, Waiblingen; Jurgen Zanzig, Weil der Stadt, both of Fed. Rep. of Germany

[73] Assignee: Alcatel N.V., Amsterdam, Netherlands

[21] Appl. No.: 760,199

[22] Filed: Jul. 29, 1985

[30] Foreign Application Priority Data

Jul. 30, 1984 [DE] Fed. Rep. of Germany ....... 3428106

[51] Int. Cl.[4] .............................................. H04B 1/58
[52] U.S. Cl. .................................... 379/405; 379/413
[58] Field of Search ....... 179/170 NC, 170 R, 170 D, 179/70, 77, 18 FA, 16 F, 16 AA; 379/322, 323, 324, 338, 340, 398, 399, 400, 402, 405, 412, 413

[56] References Cited

U.S. PATENT DOCUMENTS

| | | | |
|---|---|---|---|
| 3,855,430 | 12/1974 | Colardelle et al. | 379/405 |
| 3,970,805 | 7/1976 | Thomas | 379/395 X |
| 4,064,377 | 12/1977 | Regan | 379/405 X |
| 4,278,847 | 7/1981 | Wortman | 179/170 NC |
| 4,319,093 | 3/1982 | Bars | 179/23 |
| 4,351,060 | 9/1982 | Treiber | 375/12 |
| 4,387,273 | 6/1983 | Chea, Jr. | 379/398 |
| 4,476,350 | 10/1984 | Aull et al. | 179/70 |
| 4,571,460 | 2/1986 | Rosenbaum et al. | 179/16 AA |
| 4,600,811 | 7/1986 | Hayashi et al. | 179/16 AA |
| 4,604,741 | 8/1986 | Barsellotti | 370/69.1 |
| 4,631,359 | 12/1986 | Johansson et al. | 379/324 |
| 4,631,360 | 12/1986 | Johansson et al. | 379/324 |
| 4,631,366 | 12/1986 | Takato et al. | 340/333 |

FOREIGN PATENT DOCUMENTS

| | | |
|---|---|---|
| 2034969 | 2/1972 | Fed. Rep. of Germany . |
| 2434947 | 2/1975 | Fed. Rep. of Germany . |
| 2838038 | 3/1980 | Fed. Rep. of Germany . |
| 3237681 | 4/1984 | Fed. Rep. of Germany . |
| 3246144 | 6/1984 | Fed. Rep. of Germany . |
| 0037965 | 3/1982 | Japan .................................... 379/324 |

OTHER PUBLICATIONS

Ericsson Review; No. 4, 1983, vol. 60, "Line Circuit Component SLIC for AXE 10", p. 192.

Primary Examiner—Jin F. Ng
Assistant Examiner—R. Vaas
Attorney, Agent, or Firm—Christie, Parker & Hale

[57] ABSTRACT

There is disclosed a line circuit for connecting a subscriber set to a switching facility to obtain an impedance match. The subscriber set is connected to first and second subscriber terminals by a two-wire line which presents a complex terminating impedance to said switching facility. A constant current source is connected between the first and second terminals for supplying the subscriber set with a constant direct current. There is a control current source coupled between the first and second terminals for supplying the subscriber set with an alternating current with the control current source having a control input. The first and second terminals are connected to respective first and second inputs of a differential amplifier whose output is coupled to a transmit line. The control input of the control current source is coupled to a receive line. In order to provide an impedance match, there is a complex impedance which is coupled between the output of the differential amplifier and the control input of the current source. The receive terminal is coupled to one input of the differential amplifier by a first resistor. The first and second inputs of the differential amplifier are coupled to the first and second subscriber terminals via separate resistors of equal value with the ratio of the first resistor to one of the first and second resistors selected to provide an impedance match for said subscriber line as connected to said switching facility.

4 Claims, 3 Drawing Sheets

LINE CIRCUIT FOR COUPLING A SUBSCRIBER SET TO A SWITCHING FACILITY TO PROVIDE A COMPLEX IMPEDANCE MATCH

The present invention relates to a line circuit for coupling a subscriber set to a switching facility so as to obtain an impedance match.

A line circuit of this kind is shown in the block diagram of FIG. C on page 195 of Ericsson Review, No. 4, 1983, in an article by A. Rydin and J. Sundvall entitled "Line Circuit Component SLIC for AXE 10" (pp. 192 to 200). Such line circuits are needed in very large numbers and should, therefore, be available at low cost, so they are realized using integrated circuit techniques. In addition, only very close tolerances are permitted, so it is desirable to keep the number of components affecting the tolerances to a minimum. In particular, optimum matching to external complex impedances is to be achieved with a minimum amount of circuitry.

The object of the invention is to provide a line circuit for connecting a subscriber set to a switching facility in such a way that an impedance match is obtained.

Embodiments of the invention will now be explained in more detail with reference to the accompanying drawings, in which.

Figure 1:
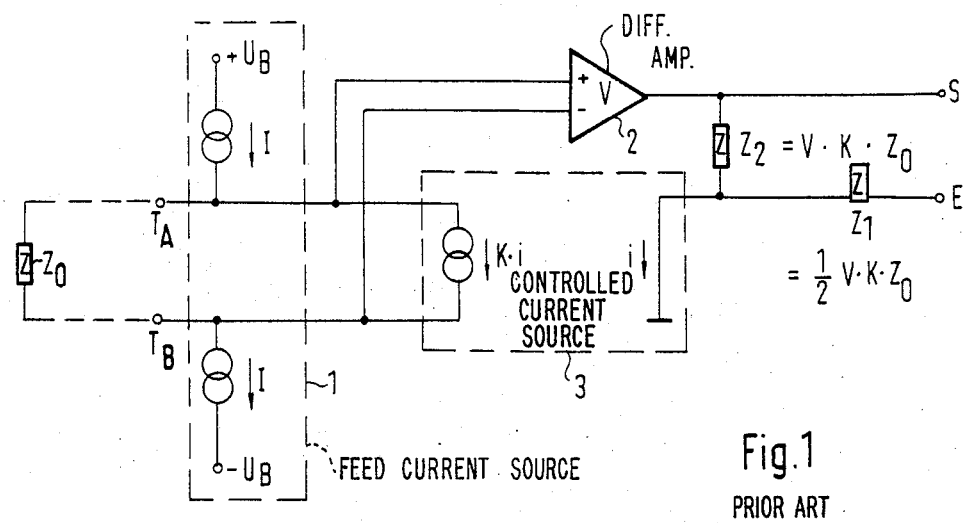
FIG. 1 is a simplified diagram of a prior art line circuit.

First, a prior art line circuit will be described with the aid of FIG. 1. The diagram basically corresponds to the block diagram shown in FIG. C of the article referred to above. A subscriber set is connected to two subscriber terminals $T_A$ and $T_B$ by a two-wire line. Both the terminating impedance of the subscriber set and the impedance of the two-wire line are equal to the complex impedance $Z_0$. The subscriber set is supplied with a constant direct current I from a feed circuit 1, and with an alternating current K·i from a controlled current source 3. The alternating current i contains the information to be received by the subscriber set.

The alternating voltage transmitted by the subscriber set is applied to the inputs of a differential amplifier 2 with the gain V. The external wiring of the differential amplifier 2 is not shown here. The output of the differential amplifier 2 is connected to a transmit line S. In addition, a feedback path leads from the output of the differential amplifier 2 to the input of the controlled current source 3. The feedback path contains a complex impedance $Z_2$. This complex impedance $Z_2$ is chosen so that, at the subscriber terminals $T_A$ and $T_B$, the line circuit is matched to the two-wire line and to the subscriber set connected to this line. The value of the complex impedance $Z_2$ is, therefore, a real multiple of the impedance $Z_0$ as long as no phase shifts occur in the line circuit. In this example, the value of the impedance $Z_2$ is equal to the value of the impedance $Z_0$ multiplied by the gain V of the differential amplifier 2 and the transfer constant K of the controlled current source. The input of the controlled current source is a current input grounded through a negligible internal resistance. The output currents of the controlled current source 3 differ in magnitude and phase from the current i flowing into the control input only by the real transfer constant K; the two output currents are inverse to each other. The control input of the controlled current source 3 is also connected to a receive line E. A signal incoming on the receive line E is transferred through the controlled current source 3 and over the two-wire line to the subscriber set. Due to the complex impedance of the arrangement, frequency-response distortion would occur on the path from the receive line E to the subscriber terminals $T_A$, $T_B$. This distortion is equalized by a complex impedance $Z_1$ between the receive line E and the input of the controlled current source 3. THe value of this complex impedance $Z_1$, too, is a real multiple of the value of impedance of the two-wire line and the subscriber set. In the example shown, the value of the complex impedance $Z_1$ is equal to half the value of the impedance $Z_0$ multiplied by the gain V of the differential amplifier and the transfer constant K of the controlled current source 3, so it is half the value of the complex impedance $Z_2$.

Figure 2:
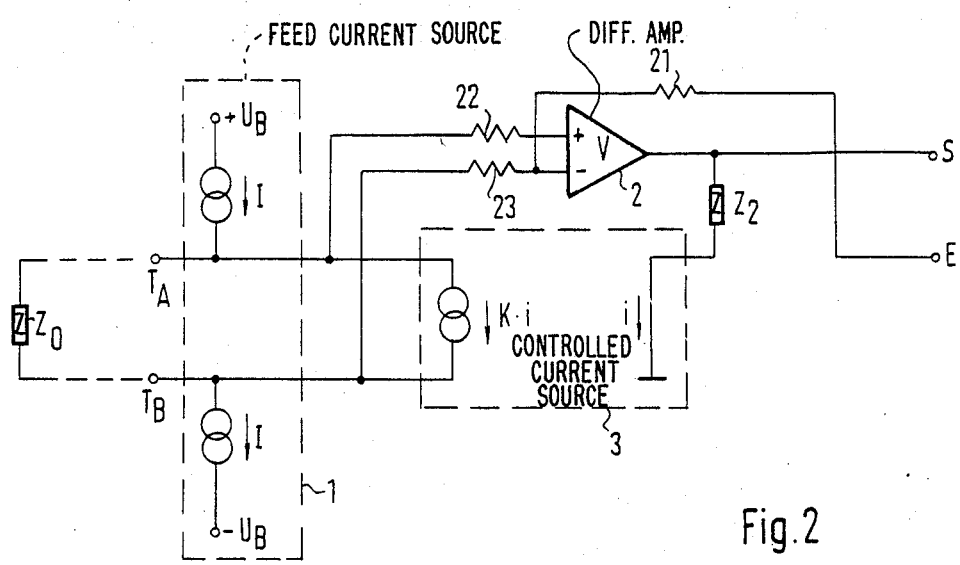
FIG. 2 shows a line circuit in accordance with the invention in the same simplified representation as in FIG. 1.

The invention takes advantage of the fact that the existing impedances have a real relationship to each other. As shown in FIG. 2, the signal coming from the receive line E is passed through the complex impedance $Z_2$ before being applied to the input of the controlled current source 3. To do this, it is applied to one input of the differential amplifier 2, whose output is connected to the input of the controlled current source 3 through the complex impedance $Z_2$. Between the subscriber terminals $T_A$, $T_B$ and the inputs of the differential amplifier 2 and between the receive line E and the differential amplifier 2, resistors 22, 23, and 21 are inserted. The resistors 22 and 23 are equal in value, and the ratio of the values of the resistors 22 and 21 follows from the ratio of the originally two complex impedances $Z_1$ and $Z_2$.

Figure 3:
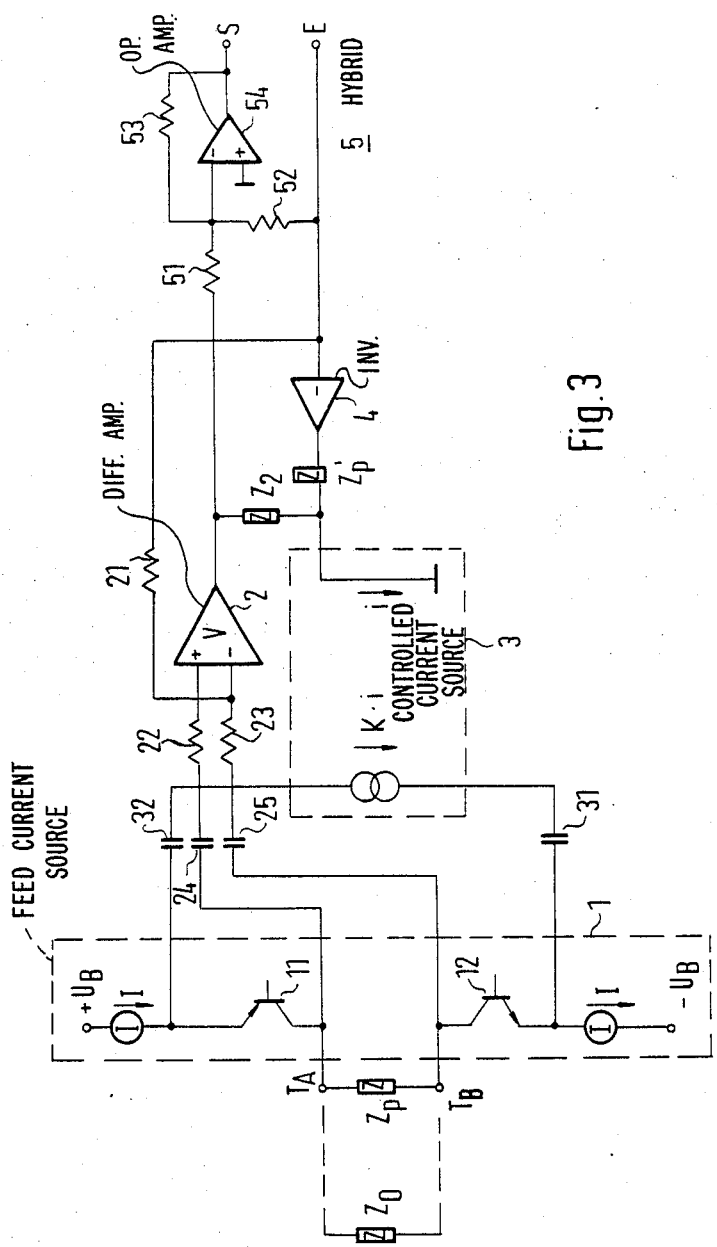
FIG. 3 shows an improvement on the line circuit of FIG. 2.

The circuit of FIG. 3 represents an improvement on the circuit of FIG. 2. Besides the desired impedances, parasitic impedances are present, both in the circuit of FIG. 1 and in the circuit of FIG. 2. Such a complex impedance $Z_p$ is shown in FIG. 3 between the subscriber terminals $T_A$ and $T_B$. The received-signal path according to the invention, explained with the aid of FIG. 2, makes it possible to compensate for the parasitic impedance $Z_p$ by interposing a compensating impedance $Z_{p'}$, between the receive line E and the input of the controlled current source 3. In the example of FIG. 3, this requires an inverter 4 in series with the compensating impedance $Z_{p'}$. According to a further advantageous feature of the invention, which is also usable in the circuit of FIG. 1, the output current of the controlled current source 3 is fed to the subscriber terminals $T_A$ and $T_B$ not directly but through the emitter-collector paths of transistors 11 and 12, respectively, which are present in the feed circuit 1 for feeding in the constant current I. This has various advantages; for example, noise voltages occurring on the two-wire line will not reach the controlled current source 3. Suitable feed circuits are disclosed, for example, in DE-OS No. 32 37 681 and DE-OS No. 32 46 144. This current feeding also permits the controlled current source 3 to be isolated from the two-wire line by wide-tolerance coupling capacitors 31 and 32 of low dielectric strength. The differential amplifier 2, too, is isolated from the two-wire line by coupling capacitors 24 and 25, as usual.

The circuit of FIG. 3 further includes a hybrid 5 of conventional design. The hybrid contains an operational amplifier 54, a feedback resistor 53, a resistor 51 connected between the inverting input of the operational amplifier 54 and the output of the differential amplifier 2, and a resistor 52 between the receive line E and the inverting input of the operational amplifier 54. The function of the hybrid 5 is to prevent any signals from being coupled from the receive line E to the transmit line S. The value of the resistor 51 is equal to the value of the resistor 52 multiplied by the gain V of the differential amplifier 2.

Figure 4:
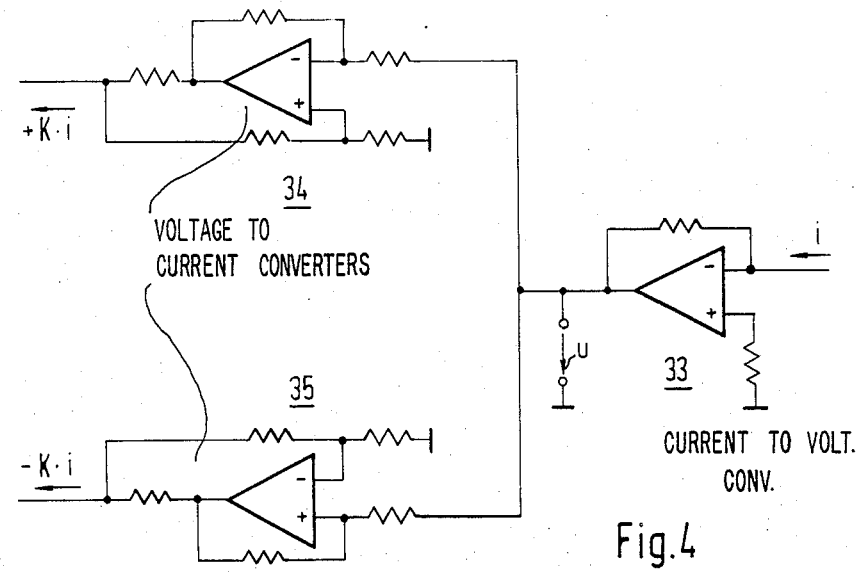
FIG. 4 shows a controlled current source of a line circuit according to the invention in greater detail.

A preferred embodiment of a controlled current source 3 in any of the above-described circuits will now be explained with the aid of FIG. 4. A current-to-voltage converter 33 converts the alternating current i to an output voltage u proportional to the current i. Two parallel connected voltage-to-current converters 34 and 35 of mirror-symmetrical construction convert the voltage i back into alternating currents. Being proportional to the alternating voltage u, these alternating currents are also proportional to the input current i. Two mutually inverse output currents $+K \cdot i$ and $-K \cdot i$ are thus obtained. The construction of the current-to-voltage converter and the voltage-to-current converters is described in greater detail in a book by U. Tietze, Ch. Schenk, "Halbleiterschaltungstechnik", 2nd edition, pp. 209 and 243, for example.

Figure 5A:
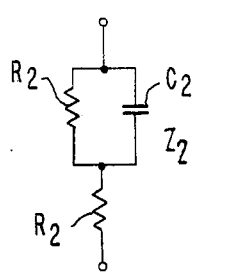
FIGS. 5a and 5b show examples of the complex impedances $Z_2$ and $Z_{p'}$.
Figure 5B:
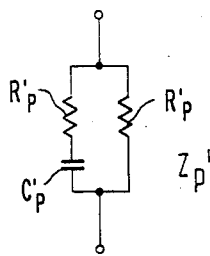

FIGS. 5a and 5b show the structures of the necessary complex impedances $Z_2$ and $Z_p'$. The matching impedance $Z_2$, located in the feedback path, consists of a resistor in series with the parallel combination of a resistor and a capacitor (FIG. 5a. The compensating impedance $Z_p'$, which compensates for the parasitic impedance $Z_p$ at the subscriber terminals $T_A$ and $T_B$, consists of a resistor in parallel with the series combination of a resistor and a capacitor.

We claim:

1. A line circuit for connecting a subscriber set to a switching facility to obtain an impedance match, said subscriber set connected to first and second subscriber terminals by a two-wire subscriber line to present a complex terminating impedance to said switching facility, a constant current source connected between said first and second terminals for supplying said subscriber set with a constant direct current, a controlled current source coupled between said first and second terminals for supplying said subscriber set with an alternating current, said controlled current source having a control input coupled to a receive terminal, a differential amplifier having a first input terminal coupled to said first terminal and a second input terminal coupled to said second terminal, with the output of said differential amplifier coupled to a transmit terminal, and a complex impedance coupled between the output of said differential amplifier and said control input of said controlled current source, wherein said receive terminal is directly coupled to one input of said differential amplifier solely via a first resistor having no imaginary impedance component, and said first and second inputs of said differential amplifier are coupled to said first and second terminals via separate second and third resistors of equal value and having no imaginary impedance components, with the ratio of said first resistor to one of said separate resistors selected to provide an optimum impedance match for said subscriber line as connected to said switching facility.

2. The line circuit according to claim 1, further including a compensating second complex impedance having a first end terminal coupled to said control input of said controlled current source and a second end coupled to said receive terminal and operative to compensate for any parasitic impedance between said first and second terminals.

3. The line circuit according to claim 1, wherein said controlled current source includes a current-to-voltage converter followed by two voltage-to-current converters and that the output currents of the two voltage-to-current converters are inverse to each other.

4. A line circuit for connecting a subscriber set to a switching facility to obtain an impedance match, said subscriber set connected to first and second subscriber terminals by a two-wire subscriber line to present a complex terminating impedance to said switching facility, a constant current source connected between said first and second terminals for supplying said subscriber set with a constant direct current, a controlled current source coupled between said first and second terminals for supplying said subscriber set with an alternating current, said controlled current source having a control input coupled to a receive terminal, a differential amplifier having a first input terminal coupled to said first terminal and a second input terminal coupled to said second terminal, with the output of said differential amplifier coupled to a transmit terminal, and a complex impedance coupled between the output of said differential amplifier and said control input of said controlled current source, wherein said receive terminal is directly coupled to one input of said differential amplifier via a first resistor having no imaginary impedance component, said first and second inputs of said differential amplifier are coupled to said first and second terminals via separate second and third resistors of equal value and having no imaginary impedance components, with the ratio of said first resistor to one of said separate resistors selected to provide an optimum impedance match for said subscriber line as connected to said switching facility, said line circuit further includes a compensating complex impedance having a first terminal coupled to said control terminal of said controlled current source and a second terminal coupled to said receive terminal and operative to compensate for any parasitic impedance between said first and second terminals, and said compensating complex impedance consists of a fourth resistor in parallel with a series combination of a fifth resistor and a capacitor.

* * * * *

UNITED STATES PATENT AND TRADEMARK OFFICE
CERTIFICATE OF CORRECTION

PATENT NO. : 4,789,999
DATED : December 6, 1988
INVENTOR(S) : Peter Meschkat; Jurgen Zanzig It is certified that error appears in the above-identified patent and that said Letters Patent is hereby corrected as shown below:

In the Drawings:

In FIGS. 5a and 5b delete the reference numerals $R_2$, $C_2$, $R'_p$, and $C'_p$.

In the Specification:

Column 2, line 15, change "THe" to -- The --.
Column 3, line 36, change "(FIG. 5a." to -- (FIG. 5a). --.

Signed and Sealed this

Thirty-first Day of October, 1989

Attest:

DONALD J. QUIGG

Attesting Officer

Commissioner of Patents and Trademarks